US007072061B2

(12) United States Patent
Blair et al.

(10) Patent No.: US 7,072,061 B2
(45) Date of Patent: Jul. 4, 2006

(54) METHOD AND SYSTEM FOR EXTRACTING INFORMATION FROM RFQ DOCUMENTS AND COMPRESSING RFQ FILES INTO A COMMON RFQ FILE TYPE

(75) Inventors: William R. Blair, Erie, PA (US); David J. Tetuan, Erie, PA (US); William E. Turcotte, Lafayette, CO (US)

(73) Assignee: Ariba, Inc., Sunnyvale, CA (US)

( * ) Notice: Subject to any disclaimer, the term of this patent is extended or adjusted under 35 U.S.C. 154(b) by 920 days.

(21) Appl. No.: 09/782,620

(22) Filed: Feb. 13, 2001

(65) Prior Publication Data

US 2002/0112114 A1    Aug. 15, 2002

(51) Int. Cl.
*G06F 7/00*      (2006.01)
(52) U.S. Cl. .......................... 358/1.15; 705/1; 711/100
(58) Field of Classification Search ............... 358/1.15, 358/1.9, 1.11, 1.13; 705/1; 709/246; 711/100
See application file for complete search history.

(56) References Cited

U.S. PATENT DOCUMENTS

| | | | |
|---|---|---|---|
| 3,581,072 A | 5/1971 | Nymeyer |
| 3,863,060 A | 1/1975 | Rode et al. |
| 4,597,045 A | 6/1986 | Kiuchi |
| 4,674,044 A | 6/1987 | Kalmus et al. |
| 4,789,928 A | 12/1988 | Fujisaki |
| 4,799,156 A | 1/1989 | Shavit et al. |
| 4,845,625 A | 7/1989 | Stannard |
| 4,992,940 A | 2/1991 | Dworkin |
| 5,136,501 A | 8/1992 | Silverman et al. |
| 5,193,056 A | 3/1993 | Boes |
| 5,243,515 A | 9/1993 | Lee |
| 5,297,032 A | 3/1994 | Trojan et al. |
| 5,375,055 A | 12/1994 | Togher et al. |
| 5,394,324 A | 2/1995 | Clearwater |
| 5,402,336 A | 3/1995 | Spiegelhoff et al. |
| 5,606,602 A | 2/1997 | Johnson et al. |
| 5,629,982 A | 5/1997 | Micali |
| 5,640,569 A | 6/1997 | Miller et al. |

(Continued)

FOREIGN PATENT DOCUMENTS

EP      0399850 A      11/1990

(Continued)

OTHER PUBLICATIONS

Andrews, "Auctions Catch the Interest of Hobbyists and Big Business", Aug. 24, 1998.

(Continued)

*Primary Examiner*—Joseph R. Pokrzywa
(74) *Attorney, Agent, or Firm*—Blakely, Sokoloff, Taylor & Zafman LLP

(57) ABSTRACT

The method and system of the present invention provides for converting all RFQ documents to a common compressed format. The method includes receiving an electronic file for use in an RFQ; extracting link information from the file and storing the extracted link information in an output file, if the file is a text-based file; extracting ISO symbol information from the file and storing the extracted symbol information in an output file, if the file is a CAD file; converting the file to a raster image; compressing the raster image into an RFQ format file, whereby, if an output file was created, the output file is used to generate a separate display layer that will display extracted information, and whereby the separate display later is inserted into the electronic RFQ format file.

26 Claims, 10 Drawing Sheets

U.S. PATENT DOCUMENTS

| | | |
|---|---|---|
| 5,664,115 A | 9/1997 | Fraser |
| 5,684,963 A | 11/1997 | Clement |
| 5,689,652 A | 11/1997 | Lupien et al. |
| 5,715,402 A | 2/1998 | Popolo |
| 5,727,165 A | 3/1998 | Ordish et al. |
| 5,758,327 A | 5/1998 | Gardner et al. |
| 5,758,328 A | 5/1998 | Giovannoli |
| 5,765,138 A | 6/1998 | Aycock et al. |
| 5,774,873 A | 6/1998 | Berent et al. |
| 5,794,207 A | 8/1998 | Walker et al. |
| 5,794,219 A | 8/1998 | Brown |
| 5,797,127 A | 8/1998 | Walker et al. |
| 5,799,151 A | 8/1998 | Hoffer |
| 5,799,285 A | 8/1998 | Klingman |
| 5,802,502 A | 9/1998 | Gell et al. |
| 5,803,500 A | 9/1998 | Mossberg |
| 5,809,483 A | 9/1998 | Broka et al. |
| 5,826,244 A | 10/1998 | Huberman |
| 5,832,496 A | 11/1998 | Anand et al. |
| 5,835,896 A | 11/1998 | Fisher et al. |
| 5,862,223 A | 1/1999 | Walker et al. |
| 5,881,213 A | 3/1999 | Shaw et al. |
| 5,890,138 A | 3/1999 | Godin et al. |
| 5,897,621 A | 4/1999 | Boesch et al. |
| 5,905,974 A | 5/1999 | Fraser et al. |
| 5,905,975 A | 5/1999 | Ausubel |
| 5,915,209 A | 6/1999 | Lawrence |
| 5,966,699 A | 10/1999 | Zandi |
| 5,978,476 A | 11/1999 | Redman et al. |
| 6,014,627 A | 1/2000 | Togher et al. |
| 6,021,398 A | 2/2000 | Ausubel |
| 6,023,685 A | 2/2000 | Brett et al. |
| 6,044,363 A | 3/2000 | Mori et al. |
| 6,055,518 A | 4/2000 | Franklin et al. |
| 6,055,543 A | 4/2000 | Christensen et al. |
| 6,058,379 A | 5/2000 | Odom et al. |
| 6,061,663 A | 5/2000 | Bloom et al. |
| 6,078,906 A | 6/2000 | Huberman |
| 6,085,198 A | 7/2000 | Skinner |
| 6,119,229 A | 9/2000 | Martinez et al. |
| 6,151,589 A | 11/2000 | Aggarwal et al. |
| 6,161,099 A | 12/2000 | Harrington et al. |
| 6,199,050 B1 | 3/2001 | Alaia et al. |
| 6,229,566 B1 | 5/2001 | Matsumoto et al. |
| 6,266,126 B1 | 7/2001 | Haneda |
| 6,266,652 B1 | 7/2001 | Godin et al. |
| 6,272,636 B1 | 8/2001 | Neville et al. |
| 6,366,891 B1 | 4/2002 | Feinberg |
| 6,560,621 B1 | 5/2003 | Barile |
| 6,623,527 B1 | 9/2003 | Hamzy |
| 6,628,415 B1 | 9/2003 | Lawrence et al. |
| 6,757,070 B1 | 6/2004 | Lin et al. |
| 6,832,264 B1 | 12/2004 | Sheinwald et al. |
| 6,834,312 B1 | 12/2004 | Edwards et al. |
| 6,928,396 B1 * | 8/2005 | Thackston .................. 703/1 |
| 2001/0028394 A1 | 10/2001 | Matsumoto et al. |
| 2002/0001396 A1 | 1/2002 | Rhoads |
| 2002/0016725 A1 * | 2/2002 | Eichstaedt et al. ............. 705/7 |
| 2002/0069295 A1 * | 6/2002 | Edwards et al. ........... 709/246 |
| 2002/0113989 A1 | 8/2002 | Ferlitsch et al. |
| 2003/0208365 A1 * | 11/2003 | Avery et al. .................. 705/1 |
| 2004/0215467 A1 * | 10/2004 | Coffman et al. ............... 705/1 |

FOREIGN PATENT DOCUMENTS

| | | |
|---|---|---|
| JP | 409101994 A | 4/1997 |
| JP | 410078992 A | 3/1998 |
| WO | WO 92/15174 | 9/1992 |
| WO | WO 97/37315 | 10/1997 |
| WO | WO 98/34187 | 8/1998 |
| WO | WO 99/63461 | 12/1999 |
| WO | WO 01/63387 A2 | 8/2001 |
| WO | WO 01/63485 A2 | 8/2001 |
| WO | WO 01/76128 A2 | 10/2001 |

OTHER PUBLICATIONS

Associated Press, "Auction on Web is Buyer's Market", Apr. 6, 1998.

"BroadVision Developing First Interactive Commerce Management System To Support Online Sales & Marketing Process; New Software Category Necessary to Interactive Network Architecture", Business Wire, p5150152, May 15, 1995.

Danny Cohen, "Computerized Commerce", Information Processing 89, Aug. 28-Sep. 1, 1989.

"FairMarket Launches New Self-Serve Auctions", Business Wire, p6161495, Jun. 16, 1998.

Jahnke, "How Bazaar", CIO Web Business Magazine, Aug. 27, 1998.

Jean-Pierre Banatre, et al., "The Design and Building of Enchere, a Distributed Electronic Marketing System" Communications of the ACM, No. 1, Jan. 29, 1986.

Lee, "Do electronic marketplaces lower the price of goods?", Communications of the PCM, v41n1 pp 73-80, Jan. 1998.

Malone, et al., "The Logic of Electronic Markets", Harvard Business Review, No. 8933II, May-Jun. 1989.

"Moai Technologies Introduces New categories of Business to Business Auction Software . . .", Business Editors and Computer Writers, Mar. 16, 1998.

Kikuchi, et al., "Multi-Round Anonymous Auction Protocols", IEICE Trans. Inf. & Syst., vol. E82-D, No. 4, Apr. 1999

"Online bidding software", Electronic Buyers' News, Issue 1072, p86, 1/6p, Aug, 25, 1997.

Sairamesh, et al., "Economic Framework for Pricing and Charging Digital Libraries", D-Lip Magazine, Feb. 1996.

"Sold!. . . To the Lowest Bidder", Computer Finance, v6, n2, Jul. 1995.

"Venture Capitalists Fund Two Massachusetts Internet Related Companies", Boston Globe, Jan. 14, 1998.

Vigoroso, "Buyers prepare for brave new world of e-commerce", Purchasing, v126, n6, pS4(1), Apr. 22, 1999.

Von der Fehr, et al., "Predatory bidding in sequential auctions", Oxford Economics Papers, v46, n3, p345(12), Jul. 1994.

"What you need to know to bid in FCC's narrowband auction", Washington Telecom News, v2, n26, p6(2), Jun. 27, 1994.

Wilder, "What's Your Bid?—FreeMarkets' real-time online bidding technology lets clients drive downcosts and improve product value", InformationWeek, Nov. 10, 1997.

Woolley, "E-muscle", Forbes, Mar. 9, 1998.

U.S. Appl. No. 60/211,285 filed Feb. 7, 2002, Eichstaedt et al.

U.S. Appl. No. 60/211,254 filed Feb. 7, 2002, Eazzetta.

U.S. Appl. No. 60/228,016 filed Feb. 7, 2002, Wentz et al.

U.S. Appl. No. 60/264,792 filed Feb. 7, 2002.

U.S. Appl. No. 60/201,266 filed Dec. 22, 2004, Wallack et al.

Freemarkets Online, "Bidware Manual," Jun. 9, 1988.

WebAuction.com, "How to Play," (1998).

Auction Sale, "Live Auctions Online," Sep. 1998.

Auction Port, "Online Auction Community - New Auctions Since Sep. 2, 1998," Jul. 1998.

OnSale, "How to Play," (1998).
u-Auction-It (1997).
Freemarkets Online, "Homepage" (1998).
Tom Steinert-Threlkeld, "New Watchwords: Let Sellers Beware," Inter@ctive Week, 3 pgs. (Jun. 1, 1998).

Associated Press, "FreeMarkets Takes Auction on Internet," Feb. 23, 1998.

* cited by examiner

```
<OBJECT data="navbar 1.fmg" type="image/x.fmg"
usemap="#map1">
    <MAP name="map 1">
    <AREA href="guide.djvu" shape="rect"
coords="0,0,118,28">|
    <AREA href="/shortcut.html" shape="rect"
coords=118,0,184,28">
    <AREA href=http://www.example.com/search.html
shape="circle" coords="184,200,60">|
    <AREA href="top10.djvu" shape="poly"
coords="276,0,276,28,100,200,50,50,276,0">
    </MAP>
</OBJECT>
```

FIG. 6

METHOD AND SYSTEM FOR EXTRACTING INFORMATION FROM RFQ DOCUMENTS AND COMPRESSING RFQ FILES INTO A COMMON RFQ FILE TYPE

BACKGROUND OF THE INVENTION

1. Field of the Invention

The present invention relates to a method and system for automating the process for creating a Request For Quotation (RFQ) document, and in particular to extracting information from the engineering drawings and specification documents used in an RFQ, and compressing the drawings and documents into a highly compressed format that includes information that was extracted.

2. Description of Related Art

A Request for Quotations (RFQ) is a complete set of documentation that communicates a buying organization's intent to buy goods and services. By issuing an RFQ, the buying organization is requesting potential suppliers to submit quoted prices for the items identified in the RFQ. An RFQ typically contains the information needed for a supplier to determine whether or not to quote, and at what price.

The RFQ typically includes technical, commercial, logistical and quality specifications. The technical information may include specifications for materials, tolerance, processes and engineering drawings. The commercial and logistical information may include information about the buyer, such as delivery address, trade terms and conditions. It may also include specific delivery information such as the party responsible for paying freight, special hours on receiving docks, etc. The quality information may include special qualifications, such as ISO9000 standards, lot acceptance and sampling specifications and testing requirements.

In the context of a supplier-bidding auction, the RFQ refers to the information provided to prospective suppliers before the auctioning event that describes the individual items or services up for bid, and other specifications that would affect cost to the bidder-supplier. RFQs used in online auctions between a buyer and potential suppliers may also have information about the upcoming online auction, such as auction start and stop times, bidding requirements and rules for participating in the auction. In addition, if the auction has the commodities separated into lots, the RFQ may contain information about the lots, and details about each line item in the lot. By reviewing the RFQ, potential suppliers can determine whether they wish to participate in an upcoming online auction, determine which lots they wish to bid on and plan a strategy for competitive bidding.

In online auctions, suppliers rely heavily on the information in the RFQ when making bids in the auction. It is therefore important that the information in an RFQ be as detailed and accurate as possible. If the RFQ were not sufficiently detailed, a supplier may not bid as low as he otherwise would, as a way of hedging against the potential unforeseen costs that are not explicitly identified in the RFQ. In a buyer-sponsored auction, where the buyer is seeking to save money by obtaining the lowest possible price by using auctioning technology, inaccurate or insufficiently detailed RFQs may result in less cost savings for the buyer. However, the time required to generate an RFQ for an online auction may be significant. Thus, there is a need to create RFQs that are as accurate as possible without adding to the amount of time it takes to create an RFQ.

RFQs contain a wide variety of information that may come from many different sources. RFQ information and documents may be acquired from an auction sponsor's own Enterprise Resource Planning (ERP) system, or other internal management system. This information may be acquired either directly from the ERP system, or from a report that was generated using the ERP system. The drawings used in an RFQ typically come from the auction sponsor's drawing vaults. Additional RFQ documents may be acquired from process planning systems and quality systems. In addition to the information and documents that are acquired from the sponsor, the RFQ may also contain auction-specific information. This information may be generated by a third-party auction coordinator or by the auction sponsor, typically the buyer.

The information that is acquired for an RFQ may include both paper documents and electronic files. The electronic files may be of any number of known file types, such as Computer-Aided Design (CAD) files, raster image files, Microsoft Word documents, basic text files, PowerPoint slides, and Excel spreadsheets to name just a few.

Traditionally, an RFQ used in an auction has been manually compiled by a buyer or by an auction coordinator. After collecting the needed documents, the RFQ document is assembled into a certain format, printed and provided to potential suppliers. In the context of online auctions, these RFQs were sent to certain potential suppliers in advance of the auction, so that the potential suppliers could determine whether they wished to participate, and plan a competitive auctioning strategy. This type of manual compilation and delivery slows down the procurement process; therefore buyers and auction coordinators began to publish electronic RFQs. Typically, the RFQ has been published at a Website on an Intranet or the Internet, or by sending a CD with the RFQ documents to the potential suppliers.

For the RFQ to be electronically published on a Website, or through a CD, all of the documents in the RFQ must be electronic. Any documents needed for an electronic RFQ that are only available on hardcopy (e.g. paper, aperture card) are generally scanned to create a raster image file of the document, or otherwise converted to an electronic file.

An electronic RFQ may therefore contain engineering drawings in CAD files and raster image files, and textual specifications in any number of file types. Therefore, several different types of viewing applications, each supporting a different file type, may be needed to be able to view all documents in an electronic RFQ.

To reduce the number of file types used in the RFQ, the textual documents may be converted to a common file type such as Portable Document Format (PDF). PDF is a file format that captures all the elements of a printed document as an electronic image that can be viewed, navigated, or printed. The PDF format can be used for text documents and compound documents containing both text and images. By converting the documents to this one common format, all of the documents can be viewed with the same PDF file viewer application.

However, a separate viewing application is still needed to view engineering drawings that are stored in a format other than PDF. Switching between the viewing applications is time-consuming and tedious for the person reading the electronic RFQ.

Thus, there is a need for a method and system whereby a buyer or auction coordinator may compile and distribute an electronic RFQ, wherein every document in the RFQ may be viewed and printed using a single viewing application.

In addition, the files used in the electronic RFQ, especially the CAD files, may be quite large. While file compression techniques are generally known, different viewing applications are still needed to view the files once they are uncompressed. Therefore, there is a need for a method and system of compressing RFQ documents whereby a single application can be used to decompress and view all documents.

SUMMARY OF THE INVENTION

In accordance with one form of the present invention, there is provided a method and system of converting all RFQ documents to a common format and compressing the converted RFQ files. The method includes receiving an electronic file for use in an electronic RFQ; extracting link information from the file and storing the extracted link information in an output file, if the file is a text-based file; extracting ISO symbol information from the file and storing the extracted symbol information in an output file, if the file is a CAD file; converting the file to a raster image; compressing the raster image into an electronic RFQ format file, whereby the compressed RFQ format file includes any extracted information stored in the output file.

A method and system for compressing a CAD file that contains ISO symbols into an RFQ format file, whereby displaying the RFQ format file will cause the ISO symbol information to be stored as a separate display layer is also disclosed. The method includes receiving a drawing in a CAD file; parsing ISO symbol information from the drawing in the CAD file and storing the symbol information in a symbol output file; converting the drawing into a raster image; compressing the raster image to an RFQ format file; and inserting the symbol information contained in the symbol output file into the electronic RFQ format file as a separate display layer in the RFQ format file.

A method and system for extracting links from a PDF file and inserting extracted link information into an RFQ format file is also disclosed. The method includes determining if there are links on the page; if there are links, creating a link output file for the page and writing link properties for each link into the link output file; converting the page to raster image; compressing the raster image into an RFQ format file; and if there are links, adding the link information from the link output file to the RFQ format file.

Accordingly, the present invention provides solutions to the shortcomings of prior electronic RFQs. Those of ordinary skill in the art will readily appreciate, therefore, that those and other details, features, and advantages will become apparent in the following detailed description of the preferred embodiments.

DESCRIPTION OF THE FIGURES

The accompanying drawings, wherein like references numerals are employed to designate like parts or steps, are included to provide a further understanding of the invention, are incorporated in and constitute a part of this specification, and illustrate embodiments of the invention that together with the description serve to explain the principles of the invention.

In the figures:

FIG. 1 is a sample screen displaying an electronic RFQ, with a navigation tree and line item details.

FIG. 2 is a sample screen displaying an electronic RFQ, with a navigation tree and text document with links shown.

FIG. 6 illustrates an example of a file created during the link extraction process of the present invention.

DETAILED DESCRIPTION

Figure 3:
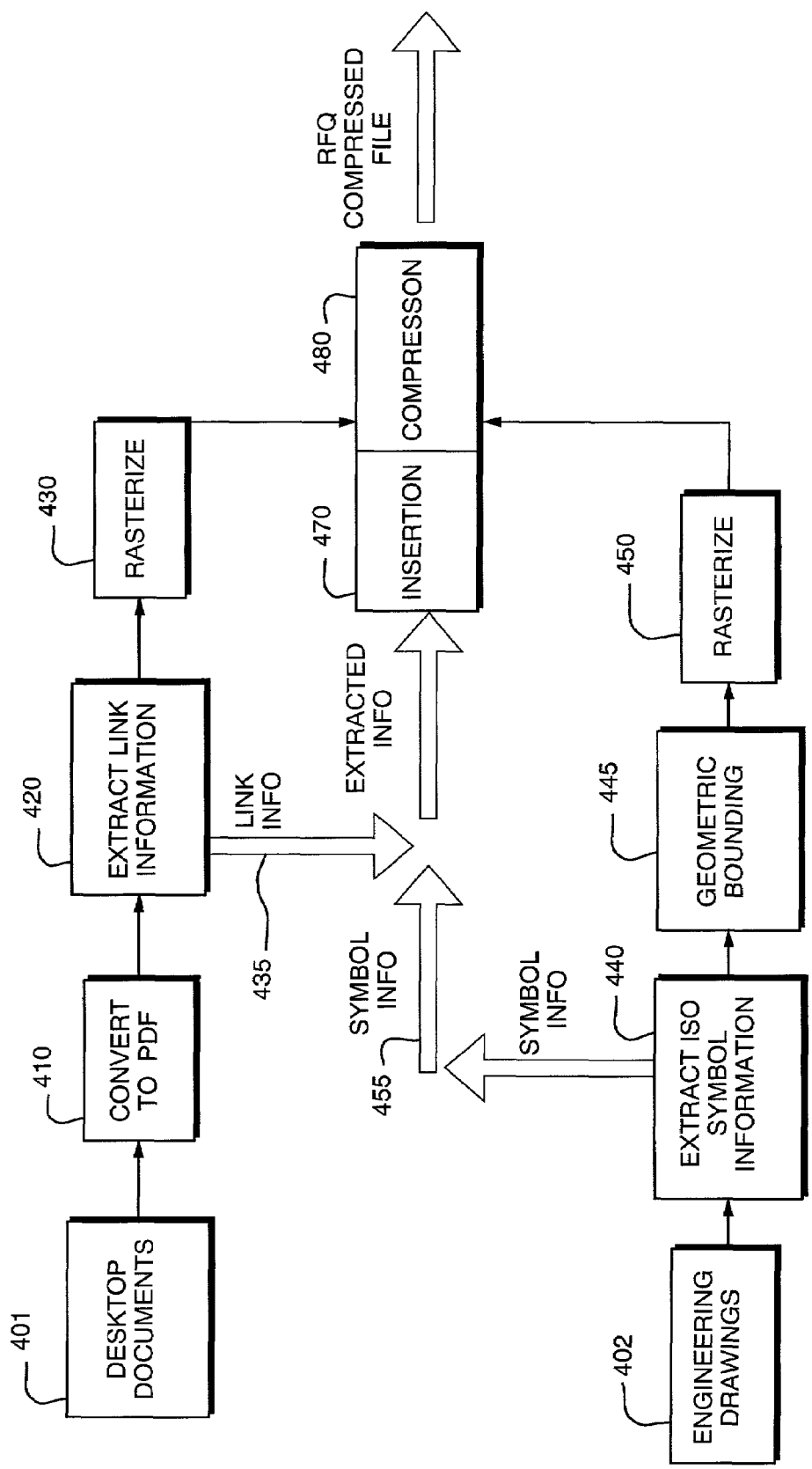
FIG. 3 is a diagram illustrating the overall process of compressing any type of file into a file for use in an electronic RFQ.

An RFQ typically contains a great deal of information, including engineering drawings, quality specifications, manufacturing process description and, where the RFQ is to be used for an auction, auction details, such as time of auction and lotting information.

The assignee of the present invention has developed methods for a potential supplier to view an electronic RFQ either on a CD or through a Web browser. The electronic files used in the RFQ are placed on a CD or on a Website, and users access the RFQ through a software program that structures and presents the information in an RFQ format. As shown in the sample screens in FIGS. 1 and 2, the software may display the RFQ by showing a tree navigation arrangement on the left side of the screen, and corresponding details on the right side. As shown in this example, the navigation tree in the electronic RFQ basically operates as a Table of Contents (TOC) to the RFQ documents. The TOC for an RFQ may, for example, have sections for contact information, bidding processes, auction timeline, award decision process, commercial specifications, quality specifications, service specifications, plant or division specific requirements as well as a section for auction lot and line item details. There are no required sections for an RFQ, and the RFQ structure may be different for each commodity or auction sponsor.

Figure 1:
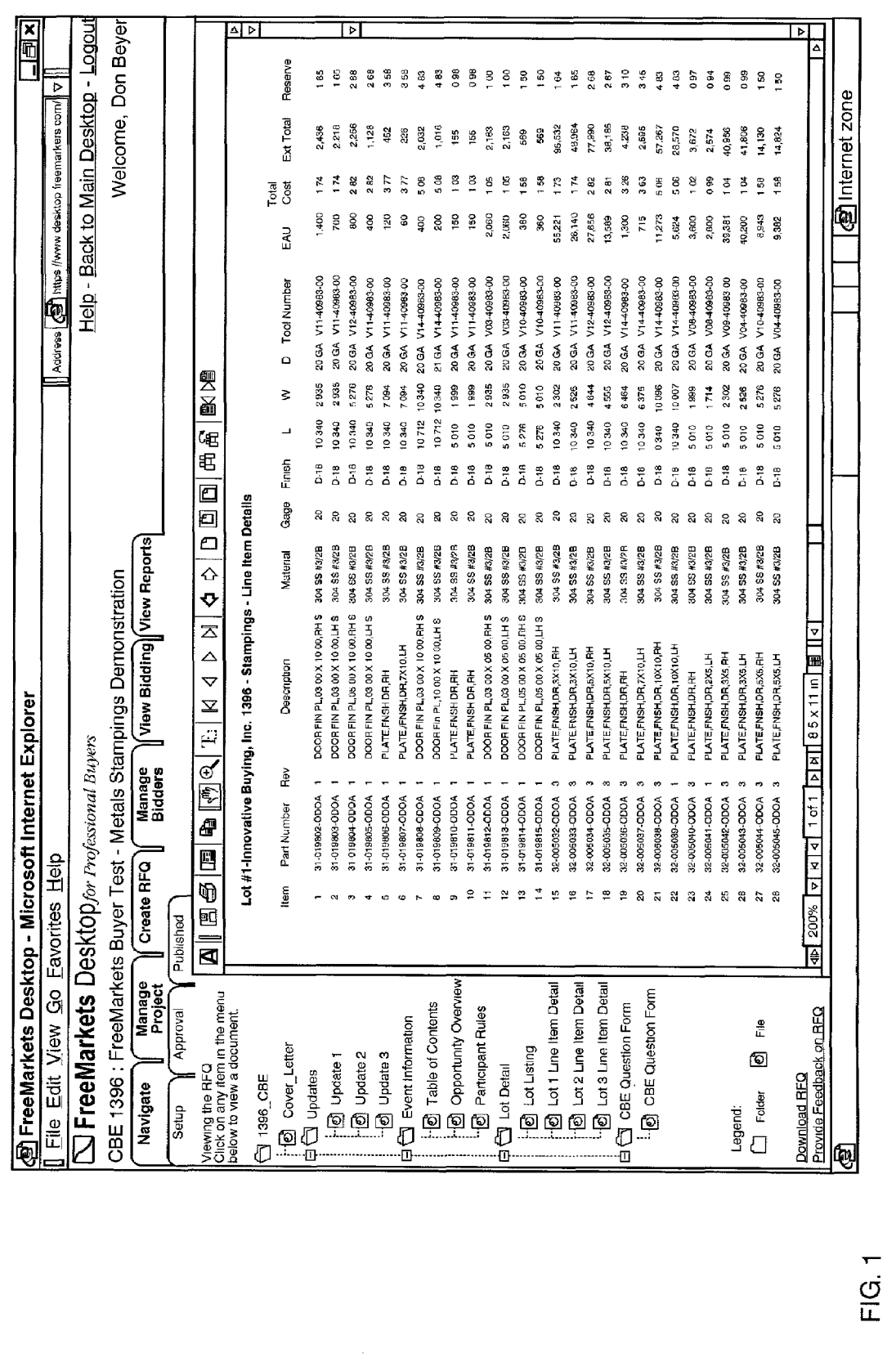
Figure 2:
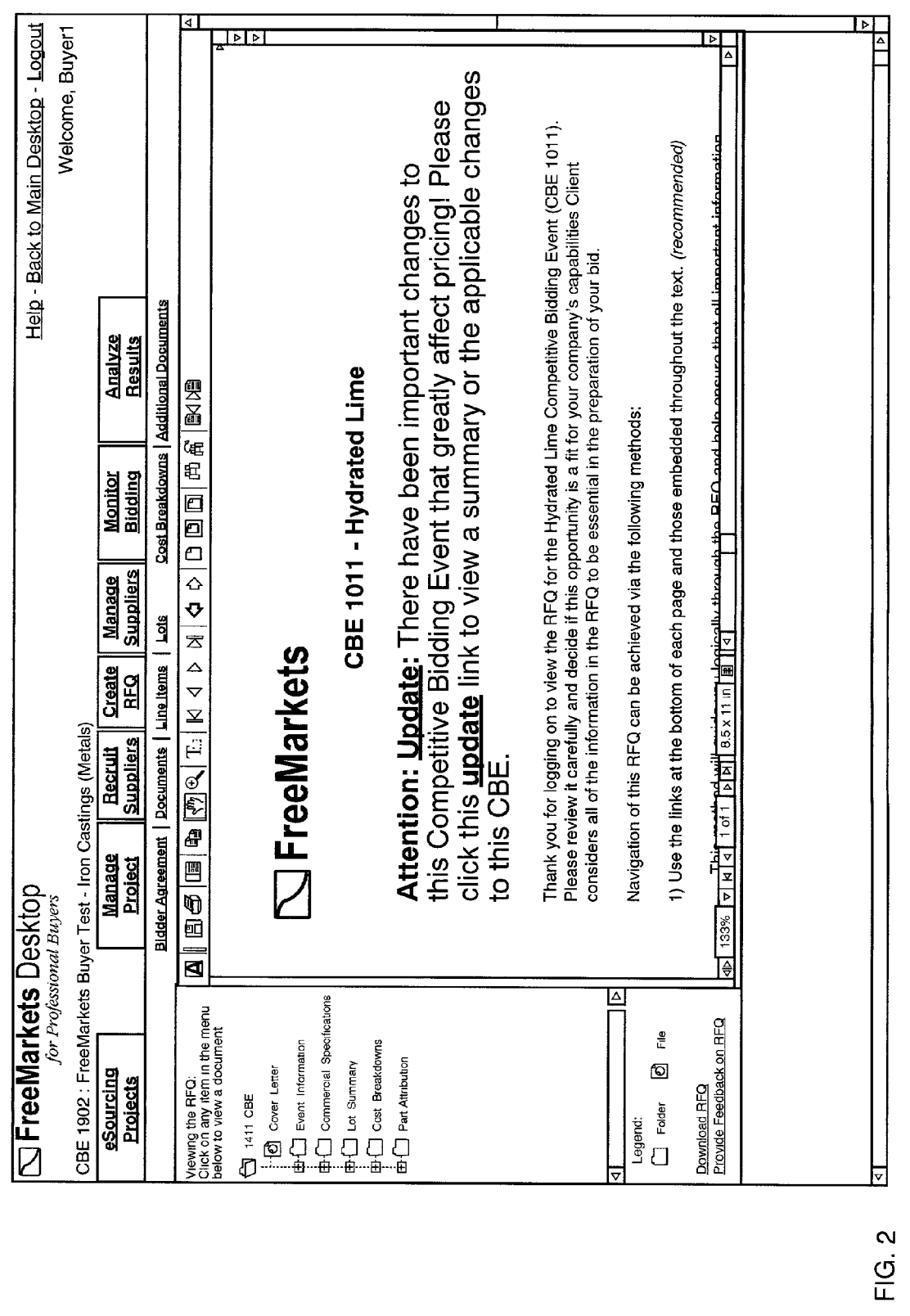

FIGS. 1–2 illustrate sample screens shown by a software application that displays the electronic RFQ. FIG. 1 shows a sample screen displaying line item details for a particular lot in an auction. FIG. 2 shows a particular document in the RFQ that is selected from the tree navigation structure. As shown in this example, this is a text document that includes hyperlinks.

Although the examples shown in FIGS. 1 and 2 illustrate using a tree navigation structure to present the RFQ, many other methods of arranging and displaying an electronic RFQ are known to those skilled in the art, and are intended to come within the scope of the present invention.

The electronic RFQ can be quite large, both in terms of number of documents and size of the files that make up the RFQ. In addition, in a supplier-bidding auction, the suppliers who are bidding to supply the buyer or sponsor of the auction with the desired products may be companies of any size and located anywhere in the world. Therefore, many of the smaller or distantly located suppliers may not have very fast connections to the Internet or other network that is being used to store the electronic RFQ. It may be unacceptably slow for these bidders to download and view the RFQ documents.

One solution to this problem has been to put the electronic RFQ on a CD and distribute the CD to potential bidders. However, the electronic RFQ may be too big to put on a single CD, even if the files are compressed. In addition, once the RFQ is on a CD, it is very difficult to make changes or updates such that all potential bidders have access to the updated information. Making the RFQ available on CD also results in increased distribution cost to the auction sponsor or auction coordinator.

One method of mitigating these problems has been to put some of the RFQ documents on CD, while making others documents available online. Typically, larger files that are not likely to be updated are placed on the CD, while smaller frequently updated files are only available online. However, the online documents may still be slow to download for many bidders, and the files on a CD still cannot be updated.

In addition to the file size problem, there are typically many different types of files in an RFQ, and therefore different application programs may be needed to view the different documents. This causes delay and tedious waiting for the user to view drawings or other documents. Web-based RFQs may require at least two browser plug-ins for viewing—one for text-based documents, usually PDF files, and one for engineering drawings. This causes delays in viewing due to context switching between the plug-ins. In addition, these viewing applications are typically standard plug-ins, such as Adobe Acrobat Reader, that are used for many different applications, not just for RFQ document viewing. These viewers typically contain many different functions, many of which are not necessary in the context of RFQ viewing. These viewing applications may therefore be unnecessarily large as they contain superfluous functionality.

In addition, current methods of accessing and viewing the electronic RFQ typically do not have batch printing capabilities. Without batch printing capability, a user that wishes to obtain a hardcopy of the electronic RFQ has to manually load each individual file and print it. As some RFQs will contain thousands of pages as part of the specification, opening and printing each file is very time-consuming and tedious for the potential bidders, and may be a disincentive to participate in the auction.

The method and system of the present invention solves these problems by storing all RFQ documents in a common compressed format whereby a single viewing application can be used to view any document in the electronic RFQ.

RFQ compression

One solution to the file size problem is to compress the files by one of many known file compression methods. However, this may cause serious delay to the user when accessing the RFQ. To view a file in the RFQ that compresses files, the file has to be decompressed before it can be viewed, which may entail the use of multiple applications—one to decompress the file, and one to view it. This type of delay is unacceptable. Some types of compression methods, such as GIF, allow for a file to be decompressed and viewed by the same application. However, these compression methods may not be appropriate for every type of file used in an electronic RFQ. Different compression methods may achieve different levels of compactness for different types of files. Essentially, it is difficult for any known compression methods to work well with all of the various types of files that may be used in an electronic RFQ and achieve sufficient compactness.

In addition, many known compression methods work best with raster image files. The documents used in the electronic RFQ are usually not in raster format when they are collected. Converting the files to a raster format ("rasterizing"), then compressing these raster files is an option, but as discussed below, valuable information is lost using this method.

The method and system of the present invention solve these problems by acquiring RFQ documents as electronic files, extracting and saving valuable information from the files, rasterizing all files, and finally compressing the raster images into a highly compressed format. The information extracted from the RFQ documents is used to generate display layers that are saved with the compressed image in an "RFQ format file". The method and system of the present invention additionally provide for a viewing application that can quickly decompress and view any of these files, whether a the file contains a text document or engineering drawing, and whether the file is on a CD or on a network. This viewing application is capable of displaying the display layers that were generated using the extracted information.

The basic process of the method and system of the present invention is shown in FIG. 3. RFQ documents 401 (e.g. specifications) may come in a number of different file types, such as typical Desktop documents. For example, quality specifications may be in Microsoft Word format or other type of text file, other specification documents may be in Excel, PowerPoint or other types of files. Frequently these documents are compound documents with both text and images. As shown by block 410, the documents are all converted to a standard format, such as PDF (Portable Document Format from Adobe Acrobat), that can handle any type of document. The PDF format is a preferred format as it can accurately preserve the original graphic appearance, and standard PDF file viewing applications do no enable the reader to edit the files. Other formats are known to those skilled in the art, and are intended to come within the scope of the present invention.

The conversion in block 410 may be performed by any party. For example, an auction coordinator may perform the conversion once it receives the documents. Alternatively, the sponsor of the auction may convert the files before sending them to the auction coordinator. If the auction sponsor is performing auction coordinator functions, it may convert the files at any time.

The documents frequently have hyperlinks and other types of information embedded in them. An example of such a document used in an RFQ is shown in FIG. 2. Rasterizing a PDF file will lose linking information, as the raster image will only capture visible aspects of the document. Therefore, in the method and system of the present invention, link information is extracted and stored at 420. The process for extracting link information is described in more detail below.

Once link information is saved, the desktop documents are then rasterized and optionally compressed at 430. Preferably, a lossless compression methodology is used. In lossless compression formats, such as GIF (Graphics Interchange Format), PNG (Portable Network Graphics) or BMP, all original data can be recovered when the file is uncompressed. With lossless compression, every bit of data that was originally in the file is restored when the file is uncompressed. Alternatively, a lossy compression technique such as JPEG, wherein only part of the original information is saved, may be used.

One preferred raster format is uncompressed TIFF (Tag Image File Format). TIFF is a common format for exchanging raster graphics (bitmap) images between application programs. Other formats are known to those skilled in the art and are intended to come within the scope of the present invention.

Engineering drawings 402 are also a crucial part of the RFQ. Many engineering drawings are stored in files created with Computer-Aided Design (CAD) applications, although some drawings may only be available as hardcopy documents or as raster files. Hardcopy engineering drawings, such as blueprints or aperture cards, may be scanned or otherwise converted to electronic image files before they are used in the inventive method and system. Engineering drawings that are stored in raster files may include files created with Printer Control Language (PCL) or other plotter codes, such as Hewlett-Packard Graphics Language (HPGL). These files can also be used as input in the system and method of the present invention. Preferably, they are converted to the same common raster format before use with the method and system of the present invention.

There are many different types of CAD files. Generally, a CAD file may be either a "native" format file, or a "standard" format file. Native formats are typically proprietary formats developed for use by a particular CAD system. Examples of native CAD formats include AutoDesk's DWF and DWG formats. Standard CAD formats include Initial Graphics Exchange Specification (IGES) and Data Exchange Format (DXF), which are standard formats used to exchange drawing data between one application and another. IGES is an American National Standards Institute (ANSI) standard, while DXF is an industry-wide de facto standard. In a preferred embodiment of the present invention, files in a native CAD format are converted to a standard format before use with the present invention.

Many engineering drawings in CAD files may contain important manufacturing information in the symbols used in the drawings. These symbols are typically ISO (International Standards Organization) symbols. For instance, a CAD drawing may have a 32 finish symbol specified for a particular part. This symbol may indicate to an engineer reading the drawing that a grinding operation is required for this part. As another example, a parallel symbol may indicate that a particular part must be parallel with another specified part. These rules and operations symbols provide a great deal of information to the manufacturing engineers reading the CAD drawings.

ISO symbols contain valuable information about the parts and required manufacturing operations. Converting a CAD engineering drawing to a common raster format will lose some of that information, as the raster image will only capture visible aspects of the drawing. In a standard CAD file, the ISO symbol information is computer-interpretable; however, once the drawing has been rasterized, the symbols are simply part of the raster image and no longer computer-interpretable.

Therefore, in the inventive system, before the engineering drawing in a CAD file is rasterized, ISO symbol information is extracted from the CAD file and stored at 440. The extracted symbol information may be used to determine required manufacturing processes and other information that may be Critical To Quality (CTQ). This information can then be used to create a separate display layer that will be used by the viewing application of the present invention for display with a raster image of the engineering drawing. The extracted information may also be used to provide input to a parts attribute database, or other databases used to automate procurement. The ISO symbol extraction process is described in more detail below.

The method and system of the present invention may also perform geometric bounding on the engineering drawings at 445. This process, described in more detail below, crops the drawings such that extraneous data that is outside the drawing border is deleted from the image. Next, all engineering drawings are rasterized at 450, preferably using the same format as is used at 430 for text-based documents.

Although FIG. 3 illustrates extracting information from the documents and CAD files before they are rasterized, as will be obvious to one skilled in the art, the extraction process may take place any time before or after the documents or drawings are rasterized. Rasterization does not alter the original documents and CAD files; therefore information can be extracted from these files at any time.

Once the engineering drawings and other RFQ documents have been converted into a common raster format, such as uncompressed TIFF, the raster images are compressed preferably using a wavelet compression scheme at 480. A wavelet is a mathematical function useful in digital signal processing and image compression. Wavelet compression works by analyzing an image and converting it into a set of mathematical expressions that can then be decoded by the receiver. Wavelet compression is preferred in the present invention, as wavelets may compress images to a greater extent than is generally possible with other methods. In some cases, a wavelet-compressed image can be as small as about 25 percent the size of a similar-quality image using the more familiar JPEG method. Thus, for example, a photograph that requires 200 KB and takes a minute to download in JPEG format might require only 50 KB and take 15 seconds to download in wavelet-compressed format. To view a wavelet-compressed file, the user's browser must support these files or use a plug-in program to read the files.

The extracted information is inserted into the RFQ compressed file as shown by 470.

The extracted link information 435 is used by the viewing application of the present invention to display and execute the links. To the user viewing the document using the viewing application of the present invention, the links in the RFQ compressed file appear and operate in a similar manner to how they appeared and operated in the PDF file. The viewing application of the present invention allows the links display layer to be toggled on and off.

The extracted ISO symbol information 455 is used to determine critical manufacturing processes and to create a symbol information layer for displaying with the drawing. This symbol information layer may also display the critical manufacturing processes required for a particular part. Alternatively, a separate manufacturing Critical To Quality (CTQ) layer may be generated using the extracted symbol information. These layers are displayed with the engineering drawing by the viewing application of the present invention. Other display layers, such as a text layer that provides more information about the symbols, may also be created. The viewing application of the present invention preferably allows each individual display layer to be toggled on and off, so that the user can control which layers to view.

Therefore, both documents and engineering drawings are converted to one common format by the system of the present invention. By compressing all of the files into a common format, only one viewing application is needed, and the viewing time is minimized. The method and system of the present invention maintains a highly compressed file format suitable for downloading over low bandwidth connections, and maximizes the amount of data that can fit on a CD.

The present invention also provides a single software application to decompress and view the compressed files. No matter what file type a document in an RFQ started as, when it is delivered as part of the RFQ generated by the inventive system, this viewing application can be used to decompress and view the document. The same single software application can be used for RFQs delivered on a Website or on a CD.

The viewing application that supports the display of files that were compressed using the inventive method and system is preferably implemented as a fast-loading browser plug-in. The viewing application provides the user with the ability to "see" links, and to activate the connected object. The viewer also may also display other layers, such as manufacturing CTQ layers, which overlay the engineering drawing and highlight manufacturing requirements.

The method and system of the present invention therefore provides for the consolidation of all data across a common format, while preserving valuable information from the RFQ input files and adds value by displaying Critical To Quality information to the RFQ reader.

Extracting Links and Hotspots from Documents

Many documents used in the RFQ contain links. Links are predefined locations or regions on an image or document that connect to other objects such as locations, files, images or applications. When displayed, links are typically shown in such a way that the user can see that it is a link, and activate the connected object.

There are typically two different types of links used in RFQ documents. The first is a hyperlink. When a user left clicks on the hyperlink, he is connected via a Uniform Resource Locator (URL) to another HTML page. The hyperlinks used in RFQ documents may be external or internal. External links connect the user out of the RFQ environment. A user should have an active Internet connection to use the link. Internal links connect to locations within the RFQ environment, such as links to other locations on the RFQ CD.

Another type of link is a hotspot. This is a region on the image that has associated data or a program. The identification to the user is the same as a hyperlink, but the result is different. When the user clicks on the hotspot, an external program may be launched, or a subwindow displayed. The hotspot information is passed from the viewing application to an external program or callback routine.

Various mechanisms can be used to show the links to users. One standard Web mechanism is to change the cursor when it passes over the link or to display a link as underlined or in a different color.

However, when a document is rasterized, some link information is lost, as it is not a visible part of the document. Although the rasterized image of the document may visually contain underlined text that looks like a link, the actual connection information is lost in the rasterizing process. Therefore, in the present invention, link information is extracted from the document before it is rasterized.

Links can be fundamentally defined by a location on a page, a region, the appearance of the link and required action. This link information is parsed out of the desktop document and saved during the extraction process. The "location" of a link is the physical location and size of the link in the page coordinate system. The coordinate system is preferably normalized so that it does not vary from document to document. The "appearance" of link is generally comprised for two main attributes, type and highlight. The type may be a visible rectangle or an invisible rectangle, for example. The information for a visible rectangle type link may additionally include a width, color and style. The value for the highlight attribute may be invert, outline or none, for example. There are a number of different "Actions" that may be associated with a link, such as execute menu item, go to view, play movie, read article, open file, WWW link, etc. Each action may have a unique set of properties associated with it.

The "region" of a link is the region of the page that is to be displayed when "show links" is activated in the viewing application of the present invention. The region may be a rectangle or a circle or any other shape with a defined location and size.

Any linked reference (URL, file name, etc) is preferably saved and may be used by the viewing application to execute the link. An optional callback routine may be provided to call instead of executing the link. If the callback function is present, the data associated with the link is returned as arguments.

The process of extracting the links parses out and saves link information from the document. Preferably, all of a link's attributes, including location, region, appearance and action, are extracted and saved in the extraction process, although in an alternative embodiment, only some of this information is extracted.

The link extractor application may be a standalone application, or it may be a component, such as a COM object, Dynamic Link Library (DLL) or library. If it is a component, it should provide the necessary interface to access and extract the required link information from a specified file type, such as PDF.

The link extractor application preferably outputs the link information to a file in Extensible Markup Language (XML) format. The extracted information typically includes a location, region and connection information for each link contained in the document. A separate file may be created for each page that contains links in the original document. Alternatively, one file may be created for a document, with a separate section for each page within the document. Alternatively, the extracted information may be stored in memory instead of a file. Other methods of storing information are known to those skilled in the art and are intended to come within the scope of the present invention. If the extracted information is stored in files, the file names are preferably constructed so that they may be mapped back to the actual document file and page number.

If the link extractor is a stand-alone application, it may be run in batch mode with no user interaction. Options or input may be passed in on the command line. The minimum arguments typically required by the stand-alone application are the name of the file to be parsed, DPI and the name of the output file that will contain the extracted link information. DPI (dots per inch) is a measure of the density of a raster file and is used to offset and scale the coordinates of a link to map to the rasterized page at the designated DPI.

If the link extractor application is a component, such as a COM object, the component should provide the interfaces necessary to support the extraction of link information. The component preferably provides an interface for accepting a file, opening the file and returning the number of pages in the document. The component preferably provides an interface that accepts a page number and returns the number of links on the page, and an interface for accepting a page number and a link number and returning all relevant information for the link including location, region and connected object. The component may be used to build the same file as the standalone application.

Figure 4A:
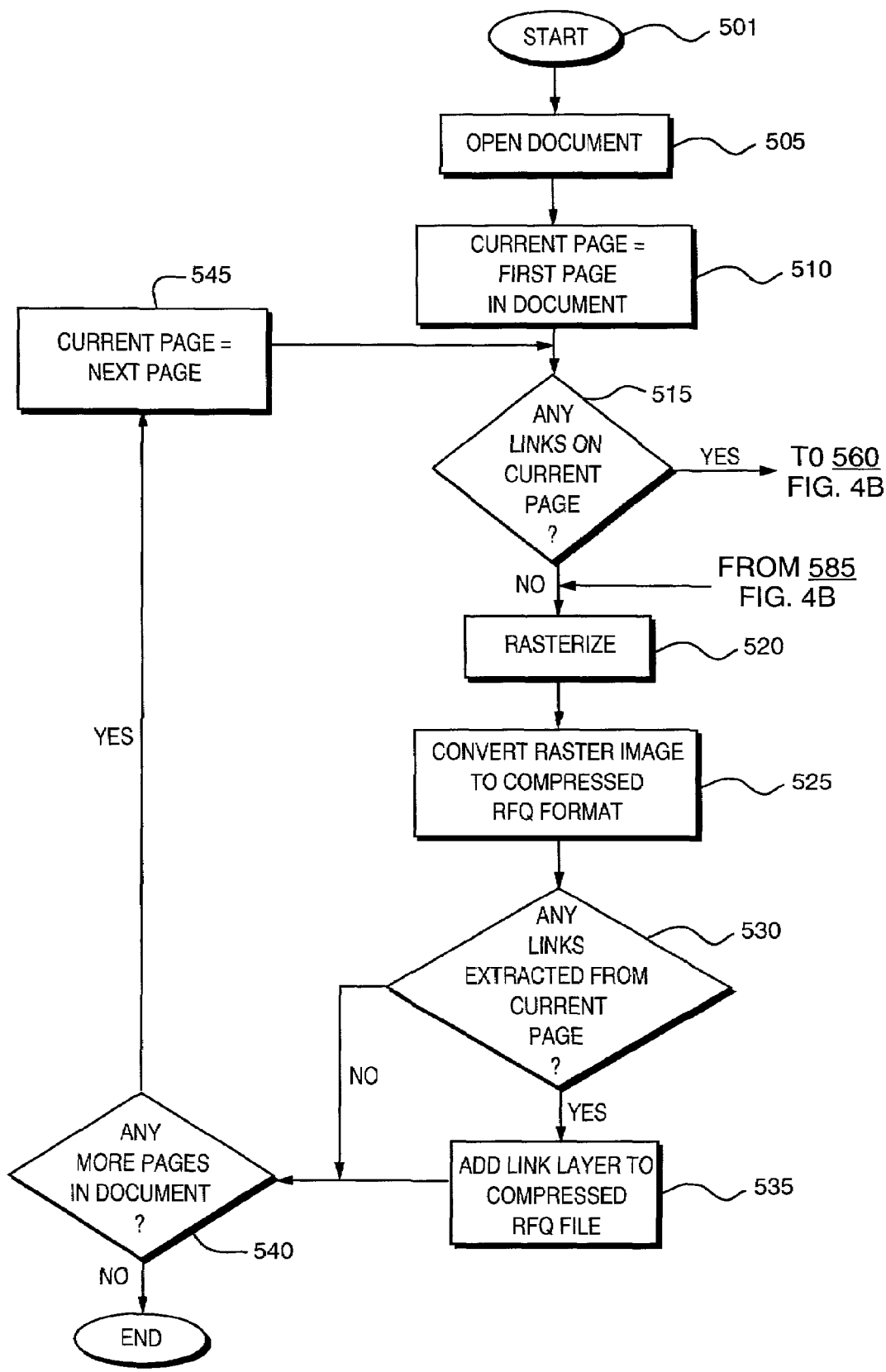
FIGS. 4A and 4B are flowcharts illustrating two embodiments of a process for extracting links from a document.
Figure 4B:
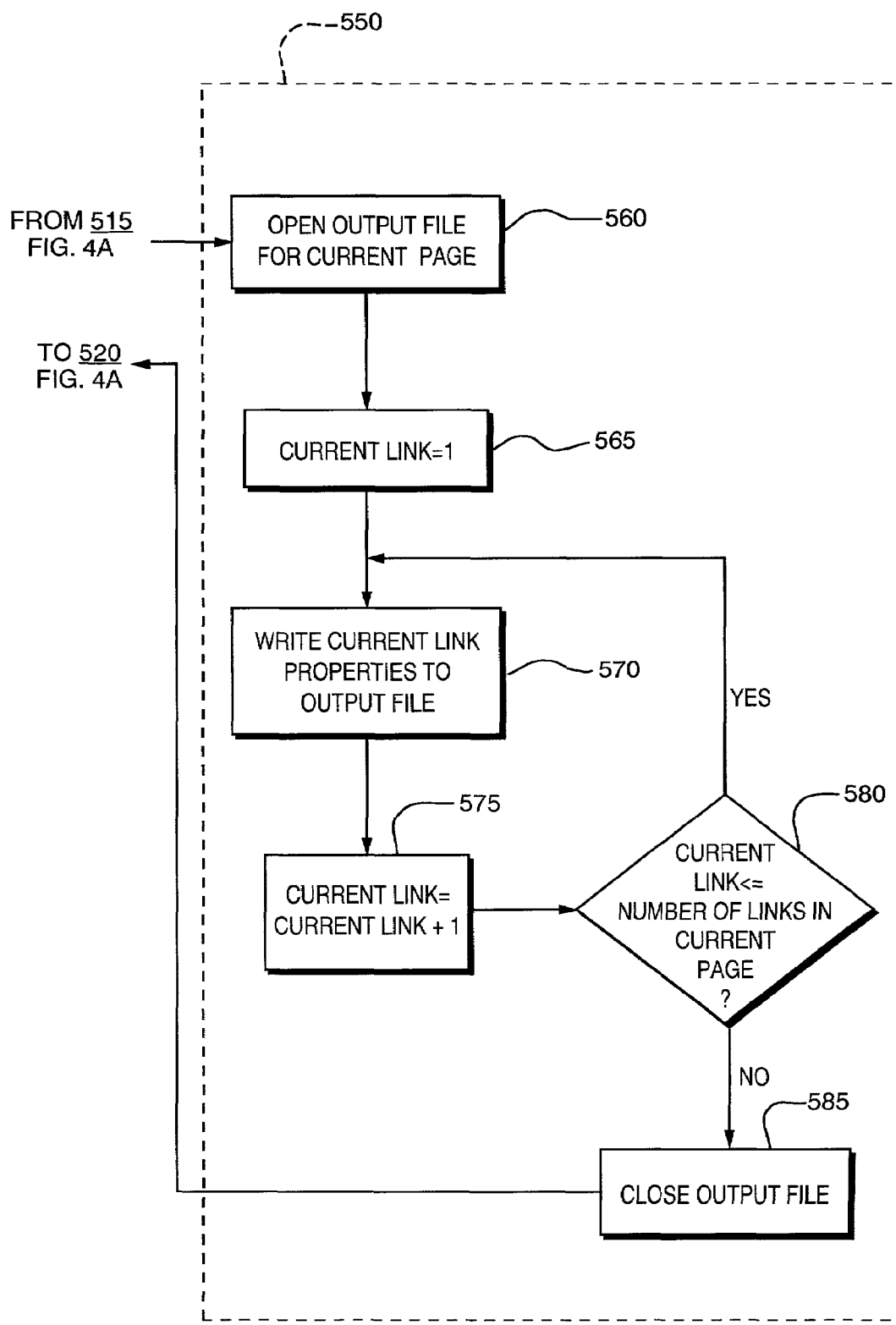
Figure 4C:
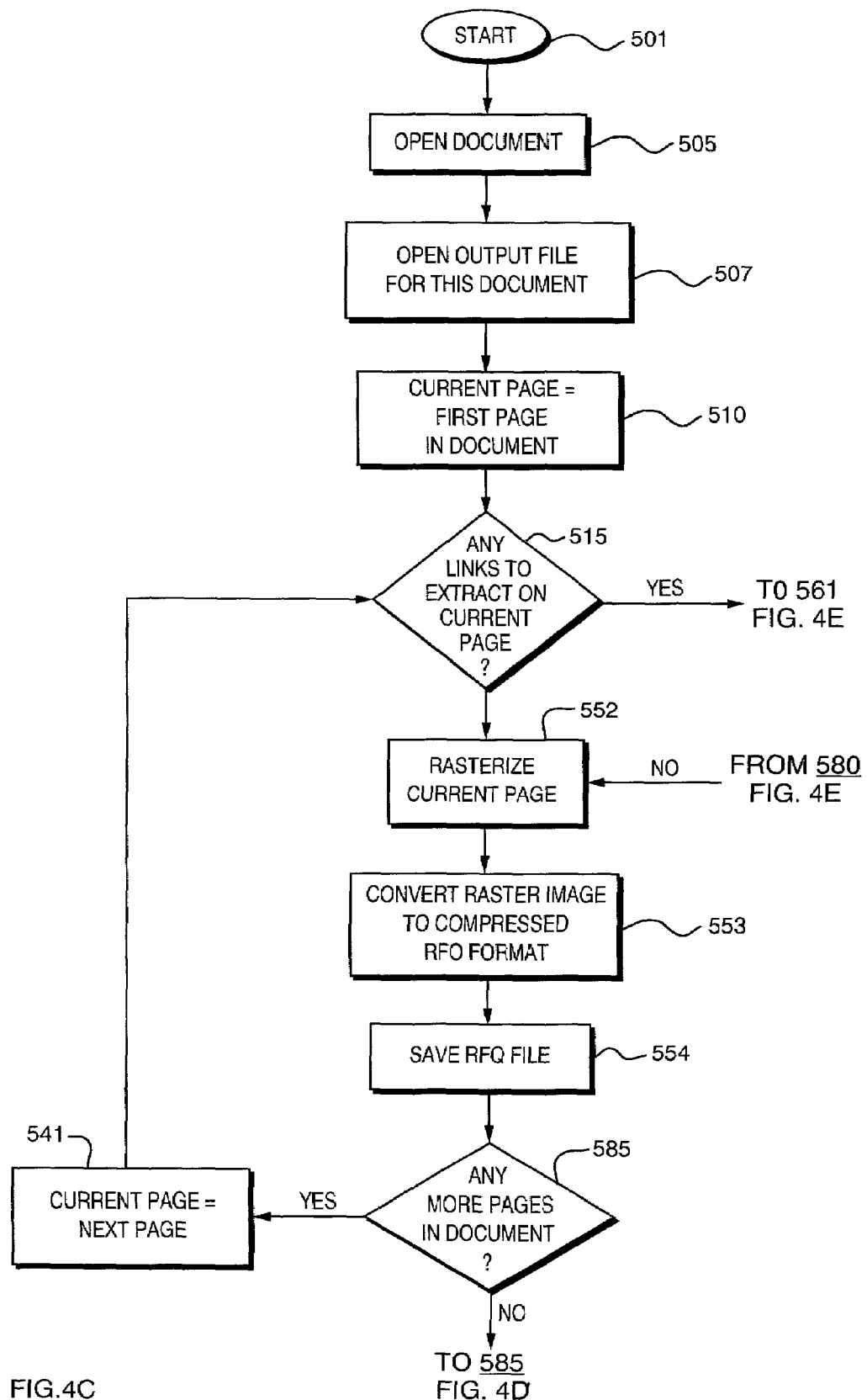
Figure 4D:
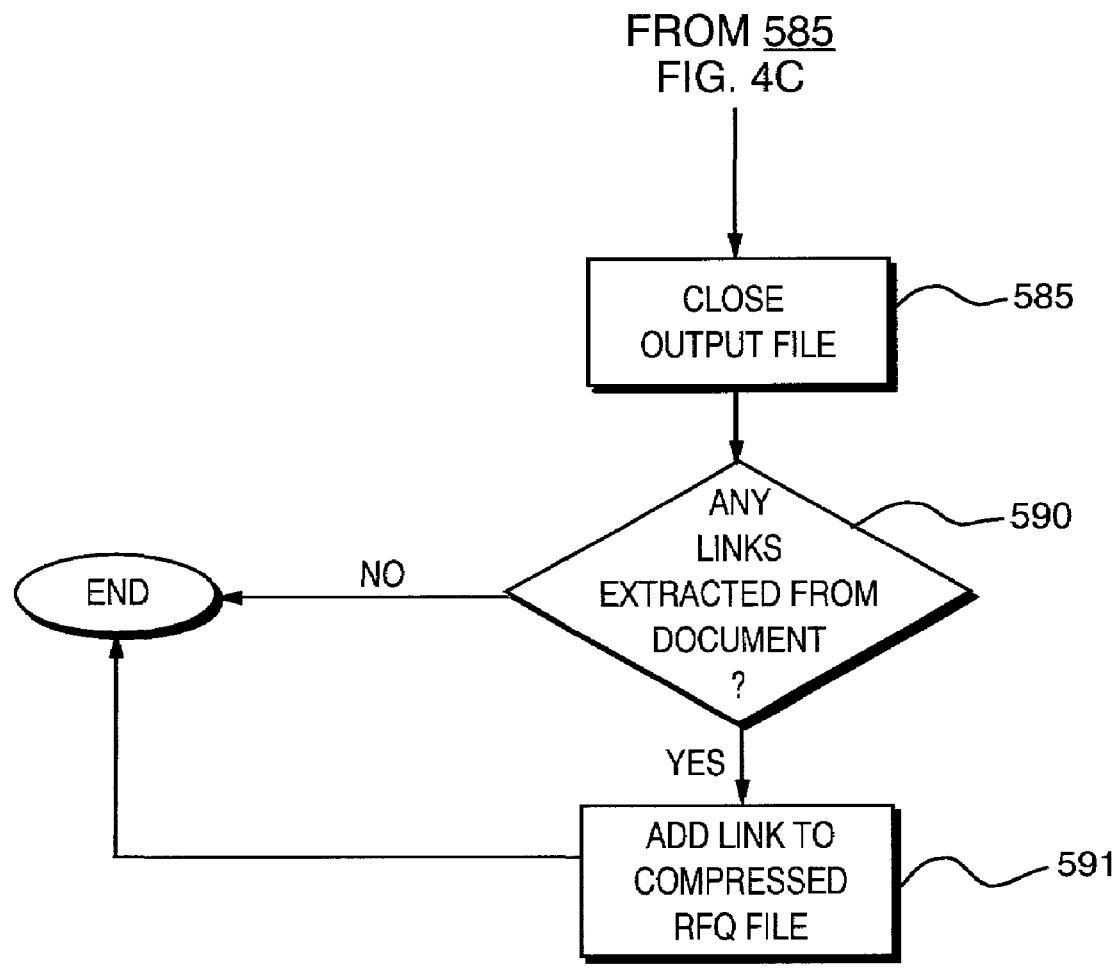
Figure 4E:
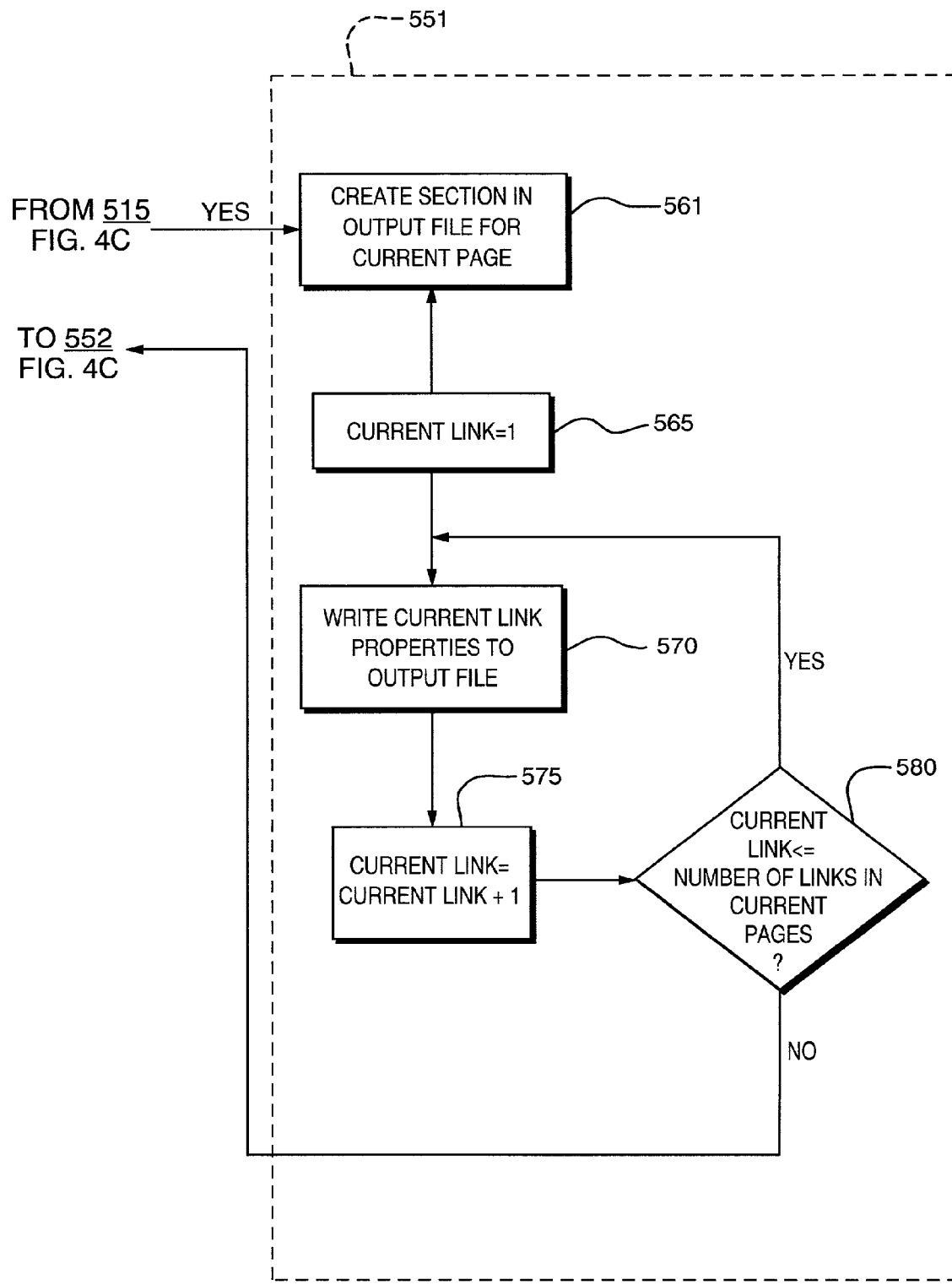

One embodiment of the process for converting a document to a compressed electronic RFQ format file of the present invention is shown in FIG. 4A, and an alternative embodiment is shown in FIG. 4B. The embodiment shown in FIG. 4A illustrates a method that creates a separate link output file for each page in a document, and the embodiment shown in FIG. 4B illustrates a method that creates a single link output file for a document that has a separate section for each page in the document.

As shown in each embodiment, the document is opened for processing at step 505. As discussed above, the document is preferably a PDF format file. The process looks at each page within the document individually to extract the links. As illustrated in FIG. 4A, if the process creates a separate output file for each page in the document, it first determines if the current page has links. If there are no links on this page, then the page is simply rasterized, as shown by 515–520. As discussed above, the rasterized image may be in TIFF format. However, if there are links in the page, the links are extracted by link extraction process 550, and the page is rasterized at 520.

Extraction process 550 in FIG. 4A illustrates a method for creating a separate output file for each page within a document. In the embodiment shown in FIG. 4A, an output file is created for each page of the document that contains links. In the extraction process 550 in FIG. 4A, an output file is created and opened at 560 when the process determines that link information is to be extracted for this page. Preferably, the file is named such that it can be related back to this page of the document. The link extraction process deals with each link sequentially, as shown by steps 570–575–580. At step 570, the properties of the current link are written to the output file for this page. These properties may include page number, link number, coordinates of the top of the link region, coordinates of the left of the link region, width of the link region, height of the link region, color of the link and type of link, and DPI, for example.

After each link on the page has been processed, the output file is closed at 585, and the page is rasterized at 520. The raster file is compressed into the electronic RFQ format at step 525. If the current page had link information extracted, it is inserted into the electronic RFQ file at step 535 as a separate display layer in the RFQ file for this page. The next page in the PDF file is then processed, until every page has been processed.

The process shown in FIG. 4A will create an electronic RFQ format file for every page of an input file. The viewing application of the present invention will read these files and display the raster image of the page with an overlay that contains the link information. The display of this link overlay can be toggled on and off in the viewing application. Users of the viewing application of the present invention will be able to see and use the links in a similar manner to using a PDF file viewing software to view the original PDF document.

The process shown in FIG. 4B illustrates an alternative method whereby a single link output file is created for a document instead of creating an output file for each page within the document. In this method, the output file is opened at 507. Each page of the document is then processed. If the current page has link information that needs to be nextracted, link extraction process 551 will create a section in the output file for the current page at 561. The link extraction process deals with each link sequentially, as shown by steps 570–575–580. At step 570, the properties of the current link are written to the output file for this page. These properties may include page number, link number, coordinates of the top of the link region, coordinates of the left of the link region, width of the link region, height of the link region, color of the link and type of link, for example.

After each link on the current page has been processed, the current page is rasterized at step 552. If there were no links to be extracted on the page, it is simply rasterized at step 552 without initiating process 551. The rasterized image is converted to the compressed RFQ format at 553 and saved at 554. Each page of the document is processed as shown by loop 515–551–552–553–554–585 and 541.

When there are no more pages in the document, the link output file is closed at 585. If any link information was extracted from the document, it is used to create a display layer or layers in the RFQ compressed file at step 590–591. This link information is determined by reading the link output file that was created in the earlier part of the process.

Two embodiments for extracting, saving and reinserting link information as a separate display layer have been shown in FIGS. 4A and 4B. Other implementations will be obvious to those skilled in the art, and are intended to come within the scope of the present invention.

Link information for every link in the document may be extracted. Alternatively, the extraction process may extract and save link information only for certain types of links. For example, only links that perform certain actions may have link information extracted. In one preferred embodiment, only links to other documents within the RFQ or URLs to Internet locations are extracted. In addition, the display layer that is generated may utilize all of the extracted information, or it may only utilize some of the extracted information.

An example of a file created using the above described process is shown in FIG. 6.

Extracting ISO Symbols from Engineering Drawings

Parts in CAD engineering drawings frequently have International Standards Organization (ISO) symbols, which specify features about the part such as diameter, perpendicularity or concentricity. The symbols on a drawing provide information that is useful for determining the manufacturing processes or supplier capabilities required for manufacturing the part. For example, a TIR concentricity symbol may indicate a centerless grinding operation is required.

When a drawing in a CAD file is rasterized, some of this information is lost. Therefore, in the system of the present invention, the ISO symbol information is extracted before the engineering drawing is rasterized. Alternatively, as creating a separate output file for a raster image of a drawing does not affect the original CAD file, the extraction process could occur after the drawing has been rasterized. Symbol information is parsed out of CAD files and may be stored in a separate output file, or may be stored in memory. The extracted symbol information may be stored in the output file as it is stored in the CAD file, or certain information may be inferred from the symbol information and stored. Using the above example, a concentricity symbol may indicate a centerless grinding operation is required for manufacture. The concentricity information may be stored alone, or information about the required manufacturing operation may be stored with the symbol information.

This output file is used to create display layers or overlays, such as a CTQ layer, for display with the engineering drawing using the viewing application of the present invention.

Figure 5:
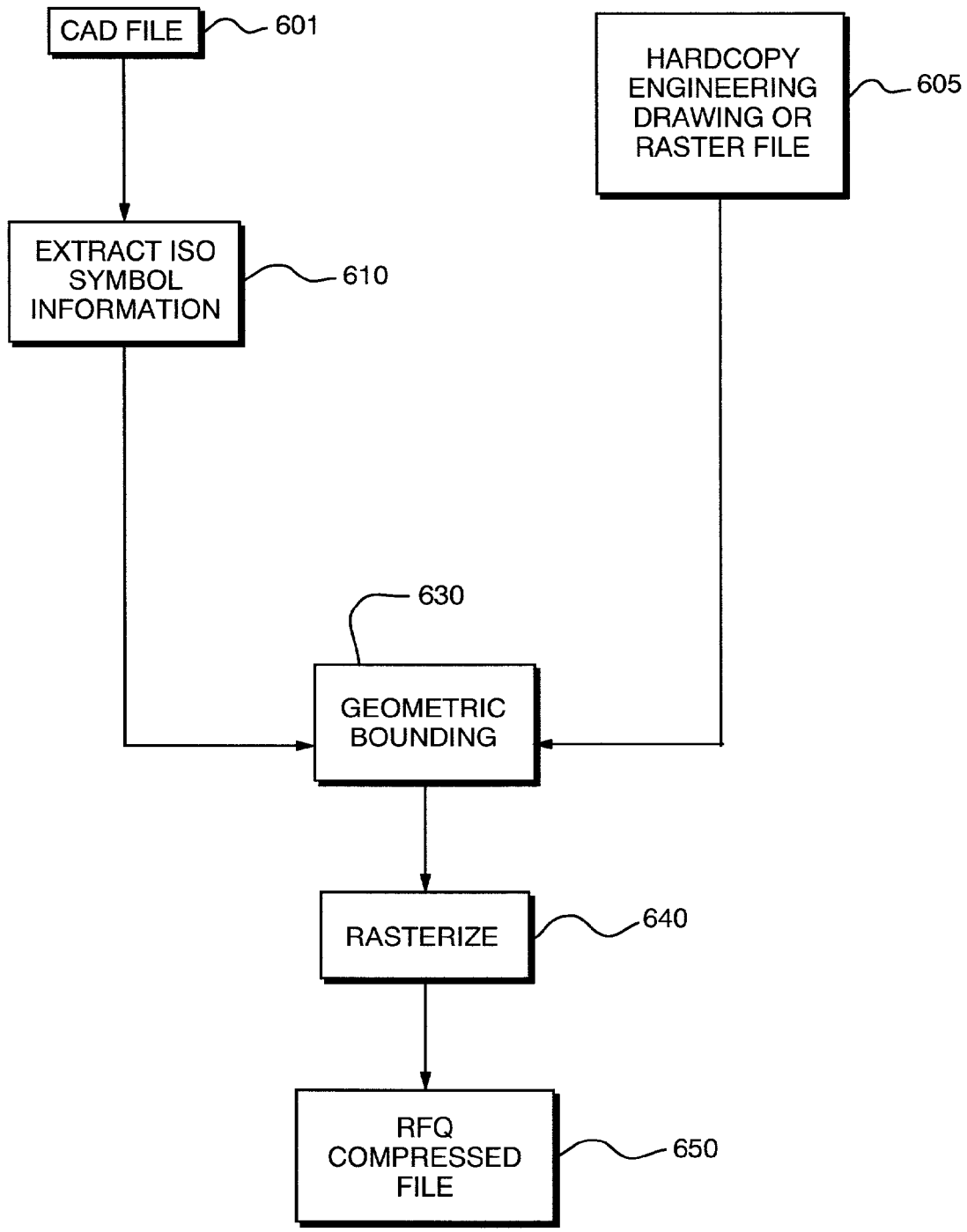
FIG. 5 is a flowchart illustrating the process of converting an engineering drawing file to the compressed electronic RFQ format of the present invention.

The basic process for converting an engineering drawing into the electronic RFQ format of the present invention is shown in FIG. 5. Block 605 illustrates an engineering drawing in a raster format file, or one that is scanned to create a raster image file. For these drawings, there is no ISO symbol information to extract. In this case, the raster image preferably goes through "geometric bounding" as shown by 630.

For raster image files, geometric bounding clips anything that is outside the defined drawing area such that, when viewed, the entire image will be shown without extraneous noise. Geometric bounding is useful for paper drawings that may have stains or other spots outside the engineering drawing area, but still on the scanned image. The clipped drawing is then saved in the common raster format, such as TIFF, at 640, and compressed into the RFQ format of the present invention at 650.

For CAD engineering drawings 601, the ISO symbol information is extracted as shown at 610. In this process, the converter reads the CAD file and searches for ISO symbol information. This information is typically stored as ASCII text strings in the CAD file. The symbol information typically includes a location, type and associated text for each symbol.

The ASCII strings in the CAD file representing symbol information are typically encoded and therefore not very user-friendly. Therefore, an optional routine will return a text description of the symbol's ASCII text string that may be used for display in a CTQ or other layer. The symbol information may also be used to determine required manufacturing processes, and this information may also be shown on a CTQ layer.

Symbol information may additionally be stored in a separate CTQ file, which is then used by the viewing application of the present invention to generate an overlay layer on the drawing or as input to other processes. In addition, textual information associated with a symbol may be added, or substituted for the symbol in this CTQ file.

In one embodiment of the present invention, the CTQ text may be separated into separate layers based upon the classification of the text. For example, "annotation", "dimensions" and "tolerances" may all be separate CTQ layers. Each of the classification layers may be highlighted in a different color, or turned on and off individually by the viewer.

By displaying symbol information on a separate layer in the viewing application, it can be shown in a different color, so that the manufacturing information is highlighted, for example. Manufacturing requirements are important to suppliers reviewing the RFQ, and by highlighting them, the suppliers are more easily able to discern requirements, and determine whether to bid on a part.

The system and method of the present invention may also use ISO symbol information to indicate the manufacturing process capabilities associated with a particular part. The system of the present invention may validate the output file with rules to process the symbol text strings, and convert to process capabilities. For example, parts that have a certain finish may be combined to determine which parts need a grinding operation. These parts may then be highlighted in a particular color in a CTQ display layer.

The symbol information may also be stored in a part attribute database. This is useful in the case that supplier information is stored in a supplier capability database. By having both of these databases, a buyer's purchase requirement can automatically be matched with suppliers with that capability.

In CAD files, construction geometry, such as lines and points, may sometimes be very far off the drawing itself. Therefore, when the CAD file is rasterized, it includes this data. When the raster image is displayed, the software displaying it tries to show the entire image on the screen—including the construction geometry—and the drawing may end up very small relative to the display on the computer screen if the construction geometry is far off the drawing. Therefore, as shown by 630, the method and system of the present invention provides "geometric bounding" for CAD files as well as raster images files, as discussed above.

For CAD files, geometric bounding defines the area that the drawing should be contained to, and deletes any objects outside that area. The engineering drawings are then rasterized at step 640.

The raster image is compressed into the standard RFQ format at 650. Any associated CTQ display layers may be inserted into this RFQ compressed file.

RFQ File Decompression and Display

The present invention also provides a single software application to decompress and display the RFQ compressed files. No matter what the original file type was, when an RFQ document is delivered as part of the electronic RFQ generated by the inventive system, the viewing application can be used to decompress and view the document. The same single software application can be used for RFQs delivered on a Website or on a CD.

The viewing application that supports the display of files compressed using the inventive method and system is preferably implemented as a fast-loading browser plug-in. The viewing application plug-in is preferably compatible with all commercially available browsers, such as Microsoft Internet Explorer(IE) and Netscape Communicator. It provides the user with the ability to "see" links, and to activate the connected object. The "look and feel" of the links when viewing the compressed file is preferably consistent with standard browsers. The viewing application also displays information determined by extracted symbol information as one or more CTQ layers that overlay the engineering drawing and typically highlight manufacturing requirements. The viewing application provides the user with the ability to toggle the display of any layer.

The viewing application preferably provides basic navigation controls, such as pan and zoom, and has standard document viewing and printing features such as paging and batch print. The viewing application preferably provides the ability for an external application to pass in parameters that enable and disable its various functions via a Command line or CGI interface.

For a document that had link information extracted and saved to the RFQ format file as described above, the viewing application preferably highlights the region around the link in the document when the user's cursor passes over the link. The link's region was saved when the link information was extracted, as described above. For example, if the user left-clicks on the region when using the viewing application of the present invention, the link's connection information is evaluated by the viewing application. This connection information was also extracted and saved in the RFQ format file for the document, as described above. If the extracted link information indicates that the link is to an external URL, for example, the new location is preferably displayed in a web browser with no change to the image displayed in the viewing application. If the link is an internal link, for example, when the user left-clicks on the link region, the new page or document is preferably displayed by the viewing application.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method of creating a compressed file for use in an electronic RFQ, comprising:

(a) receiving an electronic file for use in the electronic RFQ;

(b) if the received file is a text-based file with links, extracting link information from the file and storing the extracted link information in an output file separated from the electronic file;

(c) if the received file is a CAD file, extracting ISO symbol information from the file and storing the extracted symbol information in the output file;

(d) converting the received file to a raster image; and (e) compressing the raster image into an electronic RFQ format file, wherein if the electronic file is one of the text-based file and the CAD file, the output file is used to generate a separate display layer to display the extracted information in addition to information of the raster image, and wherein the separate display layer is inserted into the electronic RFQ format file such that the information of the display layer is displayed in response to an activation from the RFW format file.

2. The method of claim 1, whereby the text-based file is a PDF file.

3. The method of claim 1, wherein extracting link information from the file and storing the extracted link information comprises:

(i) if the file is not a PDF file, converting the text-based file to a PDF file that includes the links;

(ii) extracting link information from the PDF file; and (iii) storing the extracted link information in the output file, wherein the display layer is displayed overlaying the PDF file.

4. The method of claim 1, wherein the compression in step (e) is a wavelet-based compression.

5. The method of claim 1, wherein the raster image is in TIFF format.

6. The method of claim 1, wherein the raster image is in BMP format.

7. A system for creating compressed files for use in an electronic RFQ, wherein the system receives electronic files for use in the electronic RFQ, comprising:

means for extracting link information from a text-based file and storing extracted link information in an output file separated from the electronic file;

means for extracting ISO symbol information from a CAD file and storing extracted symbol information in the output file;

means for converting the file to a raster image;

means for compressing the raster image into an electronic RFQ format file;

means for generating a separate display layer to display extracted information in addition to the RFQ format file and overlaying the RFQ format file; and means for inserting the separate display layer into the electronic RFQ format file such that the information of the display layer is displayed in response to an activation received from the RFQ format file.

8. A machine-readable medium that includes instructions for creating a compressed file for use in an electronic RFQ, wherein such instructions, when executed by a processor, cause the processor to:

receive an electronic file for use in an electronic RFQ;

extract link information from the received file and store extracted link information in an output file separated from the electronic file, if the received file is a text-based file with links, extract ISO symbol information from the file and store extracted symbol information in the output file, if the received file is a CAD file;

convert the file to a raster image;

compress the raster file into an electronic RFQ format file;

generate a separate display layer that to display extracted information in addition to the RFQ format file; and inserting the separate display layer into the electronic RFQ format file, if information was extracted from the file, wherein the display layer is displayed overlaying the RFQ format file, and wherein extracted information is displayed from the display layer in response to an activation from the displayed RFQ format file.

9. A method of compressing a CAD file that contains ISO symbols into an RFQ format file, whereby displaying the RFQ format file will cause the information stored in the ISO symbols to be displayed in a CTQ layer, comprising:

(a) receiving a drawing in a CAD file;

(b) parsing ISO symbol information from the drawing in the CAD file and storing the symbol information in a symbol output file;

(c) converting the drawing into a raster image;

(d) compressing the raster image to an RFQ format file; and (e) inserting information from the symbol output file into the RFQ format file as a separate display layer, such that the symbol information is displayed as a CTQ layer in the RFQ format file.

10. The method of claim 9, wherein the symbol information stored in step (b) includes text descriptions of the symbols.

11. The method of claim 9, wherein the raster image in step (c) is TIFF format.

12. The method of claim 9, wherein the raster image in step (c) is BMP format.

13. The method of claim 9, wherein the compression in step (d) is wavelet-based compression.

14. The method of claim 9, wherein both symbol and text information for a symbol are displayed in the CTQ layer.

15. A system for compressing a CAD file that contains ISO symbols into an RFQ format file, whereby displaying the REQ format file will cause the information stored in the ISO symbols to be displayed in a CTQ layer, comprising:

means for receiving a drawing in a CAD file;

means for parsing ISO symbol information from the drawing in the CAD file and storing the symbol information in a symbol output file;

means for converting the drawing into a raster image;

means for compressing the raster image to an REF format file; and means for inserting the information from the symbol output file into the REF format file as a separate display layer, such that the symbol information is displayed as a CTQ layer in the REF format file.

16. A machine-readable medium that includes instructions for compressing a CAD file that contains ISO symbols into an REF format file, whereby displaying the REF format file will cause the information stored in the ISO symbols to be displayed in a CTQ layer, wherein such instructions, when executed by a processor, cause the processor to:

receive a drawing in a CAD file;

parse ISO symbol information from the drawing in the CAD file and store symbol information in a symbol output file;

convert the drawing into a raster image;

compress the raster image to an RFQ format file; and insert the information from the symbol output file into the RFQ format file as a separate display layer, such that the symbol information is displayed as a CTQ layer in the REF format file.

17. A method of extracting link information from a page in a PDF file and reinserting the link information into an REF format file, comprising:
   (a) determining if there are links on the page;
   (b) if there are links, creating a link output file for the page and writing link properties for each link into the link output file;
   (c) converting the page to a raster image;
   (d) compressing the raster image into an REF format file; and
   (e) if there are links, adding link information from the link output file to the REF format file, wherein each link is displayed in a separate display layer overlaying the REF format file, and wherein the link properties of each link is displayed in response to an activation from the displayed REF format file.

18. The method of claim 17, wherein the links are hypertext links.

19. The method of claim 17, wherein the link output file is an XML file.

20. The method of claim 17, wherein the raster image is in TIFF format.

21. The method of claim 17, wherein the raster image is in BMP format.

22. The method of claim 17, wherein the compression is wavelet-based compression.

23. The method of claim 17, wherein the link properties in step (b) include document page number, link number on the page, coordinates of the top of the link region, coordinates of the left of the link region, width of the link region, height of the link region, color of the link and type of link.

24. The method of claim 23, wherein the coordinates are mapped to the rasterized image using the coordinate system and DPI of the original document.

25. A system for extracting link information from a page in a PDF file and reinserting the link information into an RFQ format file, comprising:
   means for determining if there are links on the page;
   means for creating a link output file for the page and writing link properties for each link into the link output file;
   means for converting the page to a raster image;
   means for compressing the raster image into an RFQ format file; and
   means for adding link information from the link output file to the RFQ format file, wherein each link is displayed in a separate display layer overlaying the RFQ format file, and wherein the link properties of each link is displayed in response to an activation from the displayed RFQ format file.

26. A machine-readable medium that includes instructions for extracting link information from a page in a PDF file and reinserting the link information into an RFQ format file, wherein such instructions, when executed by a processor, cause the processor to:
   determine if there are links on the page;
   create a link output file for the page and writing link properties for each link into the link output file, if there are links;
   convert the page to a raster image;
   compress the raster image into an RFQ format file; and
   add the link information from the link output file to the RFQ format file, wherein each link is displayed in a separate display layer overlaying the RFQ format file, and wherein the link properties of each link is displayed in response to an activation from the displayed RFQ format file.

* * * * *